United States Patent
Takeda et al.

(10) Patent No.: US 6,369,731 B1
(45) Date of Patent: Apr. 9, 2002

(54) DELTA SIGMA D/A CONVERTER

(75) Inventors: Minoru Takeda; Yoshihiro Hanada, both of Tokyo; Akira Toyama, Kanagawa-ken, all of (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/724,170

(22) Filed: Nov. 28, 2000

(30) Foreign Application Priority Data

Dec. 9, 1999 (JP) ............................................. 11-350035

(51) Int. Cl.[7] .............................. H03M 1/66; H03M 3/00
(52) U.S. Cl. ...................................... 341/143; 341/144
(58) Field of Search ................................. 341/143, 118, 341/122, 144, 120; 331/1 A; 708/313

(56) References Cited

U.S. PATENT DOCUMENTS

| | | | | |
|---|---|---|---|---|
| 5,191,332 A | * | 3/1993 | Shieu | 341/143 |
| 5,311,181 A | * | 5/1994 | Ferguson et al. | 341/143 |
| 6,057,793 A | * | 5/2000 | Gong et al. | 341/143 |
| 6,067,036 A | * | 5/2000 | Mauthe et al. | 341/143 |

OTHER PUBLICATIONS

An Over Sampling A–D/D–A Conversion Technique (2) Akira Yukawa, NEC Corporation, Microelectronics Laboratory (Nikkei Electronics Aug. 8, 1998, No. 453, pp. 211–221.

* cited by examiner

Primary Examiner—Patrick Wamsley
(74) Attorney, Agent, or Firm—Jordan and Hamburg LLP

(57) ABSTRACT

The problem of the present invention is, in a plural-number order delta sigma D/A converter, not to cause click noise upon performing mute operation at no-signal input idling and hence to eliminate the necessity of a circuit for removing this.

In order to perform sequence operation for rendering zero an output signal by lowering the order of a loop filter in order when stopping the operation of a plural-number order delta sigma D/A converter, 1st-order differentiators corresponding to each order and switch means for rendering inputs to these 1st-order differentiators zero are provided in the loop filter.

5 Claims, 7 Drawing Sheets

DELTA SIGMA D/A CONVERTER

BACKGROUND OF THE INVENTION

The present invention generally relates to delta sigma D/A converters for audio applications having high S/N (Signal-to-Noise) ratio and, more particularly, to a circuit configuration of a delta sigma D/A converter of the order of 2nd-order or higher having means for reducing idling noise during no-signal input.

Conventionally, a delta sigma modulation scheme has being used as a D/A converter for audio application which is to be comparatively easily realized with high performance, such as of full harmonic distortion ratio (ratio of higher harmonic components and signals) and S/N ratio. In this delta sigma modulation scheme, there is a merit that the PCM digital signal, for example, of 16 bits or higher is converted into a low quantization signal of from 2 level (1 bit) to several-numbered level (several bits) by a noise shaping technology and reproduced into an analog signal by a several-numbered level local D/A converter. Consequently, it can be said that this scheme is a scheme adapted for a process advanced in miniaturization down to sub-micron or less, wherein absolute or relative variation increases in the analog element values such as of resistors and capacitors.

In the delta sigma modulation scheme, because quantization noise distributes with deviation to a higher frequency region (called noise shaping), a high S/N ratio is available by removal through a low pass filter. It is known that S/N ratio is theoretically dependent upon the order, sampling frequency and quantization level of a delta sigma modulator (called also a noise shaper) (see "A-D/D-A Conversion Technology of an Over-sampling Scheme, 2nd round", Nikkei Electronics 1988.8.8 No. 453 pp. 211–221).

Although, theoretically, higher S/N ratio is to be obtained with higher order of the noise shaper, conversely the operation of a feedback system becomes instable. Due to this, it is usual that the D/A converter usually has a 3rd-order to 4th-order noise shaper.

In this delta sigma modulation scheme, the noise shaper possesses a loop filter wherein this loop filter is in operation without stoppage when the input signal becomes an absence of a signal. Due to this, even if the input signal is a zero fixed value, a constant data pattern appears in output values of the noise shaper. It is known that this results in occurrence of undesired phenomenon outputting a particular spectrum in the audio (audible) band.

Conventionally, as a countermeasure to this there have been a method of applying intentionally-caused noise called dither to the noise shaper signal. This dither is a technology not limited to the D/A converter but utilized also in the A/D converter. There seems to be no especial problem if the dither is out of the audible frequency band. However, despite actually out of the audible band, large noise if caused is disadvantageous for the S/N ratio of an analog circuit in a rear stage of the noise shaper.

Due to this, there is as another countermeasure a method of stopping the noise shaper when the input signal detects zero for a constant period of time.

The conventional stopping methods includes, for example, one disclosed in Japanese Patent Publication No. 118647/1995. This provides a switch on an output side of the noise shaper so that the output is forcibly rendered zero by switching this switch. However, there has been a problem that this switching of the switch conversely causes noise posing a problem in an audio sense at that instance.

FIG. 7 shows a conventional example of a 3rd-order delta sigma D/A converter (noise shaper) disclosed in Japanese Patent Publication No. 118647/1995. Usually, the operation of a noise shaper is expressed as a system function using a "z-converted" function often used in the discrete signal processing. It is assumed that the input signal to a noise shaper is $X(z)$, the input signal to a quantizer Q is $U(z)$, the output signal is $Y(z)$ and the quantization noise caused by the quantizer is $N(z)$. The error signal $E(z)$ occurring across the quantizer Q is a change of symbol of the quantization noise caused within the quantizer Q and expressed by the following formula:

$$E(z) = \{U(z) - Y(z)\} = -N(z) \tag{1}$$

Next, because the system function of the 1-sample delayer is expressed as $(Z^{-1})$, a system function of an FIR-filter-type loop filter having an input of $E(z)$ and configured by three 1-sample delayer D1, D2, D3, a multiplier and an adder can be expressed by:

$$F(z) = (3z^{-1} - 3z^{-2} + z^{-3}). \tag{2}$$

The output $V(z)$ of the FIR-filter-type loop filter is to be expressed by the following:

$$V(z) = F(z) \cdot E(z) \tag{3}$$

Furthermore, from these $V(z)$ and input $X(z)$, the relation to the input of $U(z)$ the quantizer Q is to be expressed as:

$$U(z) = X(z) + V(z). \tag{4}$$

From the above relationship, the output signal $Y(z)$ of the noise shaper is expressed as:

$$\begin{aligned} Y(z) &= U(z) + N(z) \\ &= X(z) + (1 - 3z^{-1} + 3z^{-2} - z^{-3})N(z) \\ &= X(z) + (1 - z^{-1})^3 N(z). \end{aligned} \tag{5}$$

From this, the noise component contained in the output $Y(z)$ has a noise distribution expelled from a lower frequency side to higher frequency side, as expressed by the following system function:

$$\begin{aligned} H(z) &= (1 - z^{-1})^3 \\ &= (1 - 3z^{-1} + 3z^{-2} - z^{-3}) \end{aligned} \tag{6}$$

This is a reason of being called noise shaping. The S/N ratio can be improved by removing noise component with a low pass filter as stated above.

In a conventional example shown in FIG. 7, a switch is provided on an output side of a quantizer Q of a 3rd-order delta sigma D/A converter. By this switch, the output $Y(z)$ is switched directly to zero value. That is, when detecting the input signal $X(z)$ is zero by a not-shown detector, a mute request signal MTR is turned on. Then, if a quantization error $E(z)$ in absolute value is smaller than a constant value REF, the switch S is switched such that the output is put in zero value after a delay of a constant period of time. Due to this, the operation of the noise shaper is stopped.

However, in the conventional-example 3rd-order noise shaper structure, there is a possibility of causing great sound in an audio fashion at the instance of rendering to zero value. The way of applying mute in this manner is not preferred because of possibility of causing noise in an audio fashion.

In this manner, the conventional plural-number-order delta sigma D/A converter for audio applications has the switch provided on the output side in order to prevent idling noise caused at no-signal input by the noise shaper and stop the operation of the noise shaper. In such a case, however, there is a possibility of causing click noise. In order not to input this to a rear-staged amplifier, a separate circuit measure has been required for removal. That is, there is a problem that signal passes be increased and the control circuit be extensionally provided for them.

Therefore, it is an object of the present invention to prevent occurrence of noise not preferred in an audio sense upon switching the switch for muting in a delta sigma D/A converter.

Another object of the invention is to provide a novel circuit configuration and its stop sequence for a delta sigma D/A converter of a plural-number order capable of performing mute operation without causing click noise upon no-signal input.

SUMMARY OF THE INVENTION

In order to achieve the objects, the present invention has the following configuration to apply mute for rendering zero an output of a delta sigma D/A converter of a plural number of order.

That is, in an nth-order (n is an integer of 2 or greater) delta sigma D/A converter, there comprises: a main adder to be inputted by an input signal; a quantizer having as an input an output of the main adder; a 1-sample delayer having as an input a quantization error by the quantizer; 1st-order differentiators of (n−1) in number connected continuous to an output side of the 1-sample delayer; switch means of (n−1) in number for switching each output of the 1st-order differentiators to zero value; and adders of (n−1) in number connected continuous to add together outputs of the 1st-order differentiators or an output of the 1-sample delayer. A sum of the adder of (n−1) in number is added with the input signal by the main adder.

When the input signal is zero value, the switch means of (n−1) in number being switched to zero value in the order of from a highest order to a lower order, inputs of the 1st-order differentiators of (n−1) in number being rendered zero value, and an output value of the nth-order delta sigma D/A converter being rendered finally zero value.

Also, multipliers of n in number may be provided on an input side of the adders of (n−1) in number for multiplying and adding an output of the 1-sample delayer or outputs of the 1st-order differentiators of (n−1) in number by a predetermined real number. Incidentally, the n is typically 3 or 4.

The operation of the invention will be explained, for example, on a 3rd-order delta sigma D/A converter wherein n=3.

A 3rd-order delta sigma D/A converter has a 1-sample delayer, first and second 1st-order differentiators connected continuous to an output side of the 1-sample delayer, and first and second switch means to input zero values respectively to the first and second 1st-order differentiators, and further a first adder and second adder to add an output of the 1-sample delayer with outputs of the first and second 1st-order differentiators.

In the invention, an output of the 1-sample delayer having as an input a quantization error signal E(z) is given by:

$$V_1(z) = E(z) \cdot Z^{-1}. \tag{7}$$

A system function of the first 1st-order differentiator to be selectively inputted with an output $V_1(z)$ of the 1-sample delayer or zero value by the first switch means is given by:

$$G_1(z) = (1 - z^{-1}) \tag{8}$$

and the output of the first 1st-order differentiator is:

$$V_2(z) = V_1(z)(1 - z^{-1}). \tag{9}$$

A system function of the second 1st-order differentiator to be selectively inputted with an output $V_2(z)$ of the first 1st-order differentiator or zero value by the second switch means is:

$$G_2(Z) = (1 - z^{-1}) \tag{10}$$

and the output of the second 1st-order differentiator is:

$$V_3(z) = V_2(z)(1 - z^{-1}). \tag{11}$$

The output $V_1(z)$ of the 1-sample delayer and $V_2(z)$ and $V_3(z)$ of the first and second 1st-order differentiators are added by the first and second adders, a sum of which $$V(z) = \{V_1(z) + V_2(z) + V_3(z)\}$$

is added to the input signal X(z) by the main adder. A sum V(z) of the loop filter can be expressed as:

$$\begin{aligned} V(z) &= \{V_1(z) + V_2(z) + V_3(z)\} \\ &= E(z) \cdot z^{-1} + E(z) \cdot z^{-1}(1 - z^{-1}) + E(z) \cdot z^{-1}(1 - z^{-1})^2 \\ &= (3z^{-1} - 3z^{-2} + z^{-3})E(z). \end{aligned} \tag{12}$$

Accordingly, $$\begin{aligned} Y(z) &= U(z) + N(z) \\ &= X(z) + V(z) + N(z) \\ &= X(z) + (3z^{-1} - 3z^{-2} + z^{-3})E(z) + N(z) \\ &= X(z) + (1 - 3z^{-1} + 3z^{-2} - z^{-3})N(z) \\ &= X(z) + (1 - z^{-1})^3 N(z). \end{aligned} \tag{13}$$

This is the same as the system function F(z) of the general 3rd-order loop filter as stated above.

In the invention, when the input signal X(z) is zero value, the input to the 1st-order differentiator is switched to zero value in the order of from a highest-order switch means to a lower order switch means. In the case of 3rd-order, the second switch means first switches the input to the second 1st-order differentiator to zero, and an output $V_3(z)$ thereof is rendered zero value. Next, the first switch means switches the input to the first 1st-order differentiator to zero value, and an output $V_2(z)$ thereof is switched to zero value. Thereupon, the loop filter of the invention will lower in its order in the order as 3rd-order, 2nd-order and 1st-order.

The reason of switching to zero value beginning from the input of the highest-ordered 1st-order differentiator in this manner is that even at the absence of an input signal X(z) when muting the noise shaper in an idling state, noise greater in quantization step number occurs as the order is higher.

By thus switching to zero input in the order of from the highest-ordered 1st-order differentiator, it is possible to prevent against occurrence of such noise upon muting as has been caused in the conventional examples.

When the input signal U(z) of the quantizer becomes a constant value or smaller, because the quantizer has a function of neglecting an input signal U(z) of the constant value or smaller, the output signal Y(z) becomes finally zero.

DETAILED DESCRIPTION OF THE PREFERRED EMBODIMENTS

Hereunder, embodiments of the present invention will be explained with reference to the drawings.

Figure 1:
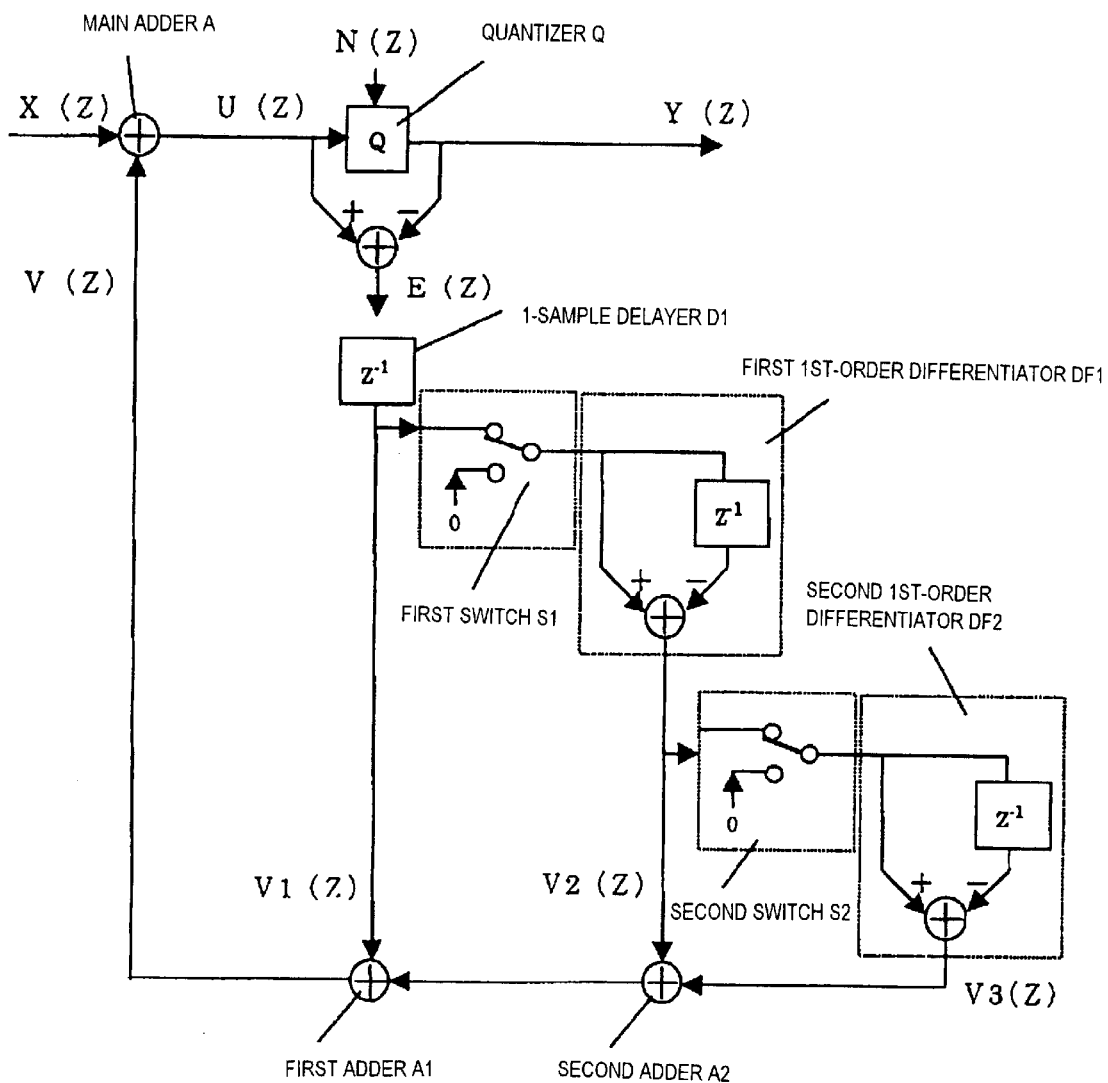
FIG. 1 is a diagram showing a configuration of a 3rd-order delta sigma D/A converter of one embodiment of the present invention.

FIG. 1 is a block diagram showing a configuration of a first embodiment of a 3rd-order delta sigma D/A converter of the invention. This 3rd-order delta sigma D/A converter comprises a main adder A having an input signal X(z) as one input, a quantizer Q having as input signal U(z) an output of the main adder and generating an output signal Y(z), a 1-sample delayer D1 to which inputted a quantization error signal across the quantizer E(z)={U(z)−Y(z)} (note, quantization noise is expressed as N(z)=−E(z)), a first 1st-order differentiator DF1 having as an input an output $V_1(z)$ of this 1-sample delayer, first switch means S1 for selectively switching an input to this first 1st-order differentiator DF1 from $V_1(z)$ to zero value, and a second 1st-order differentiator DF2 having as an input an output $V_2(z)$ of the first 1st-order differentiator DF1, second switch means for selectively switching an input to this second 1st-order differentiator DF2 from $V_2(z)$ to zero value, a second adder A2 for adding an output signal $V_2(z)$ of the first 1st-order differentiator DF1 and an output signal $V_3(z)$ of the second 1st-order differentiator DF2, and a first adder A1 for adding an output of the second adder A2 and an output $V_1(z)$ of the 1-sample delayer D1.

The output of the first adder V(z)=$V_1(z)$+$V_2(Z)$+$V_3(z)$ is given as another input to the main adder A. That is, these 1-sample delayer D1, first and second 1st-order differentiators DF1 and DF2, first and second switch means S1 and S2 and first and second adders A1 and A2 constitute a loop filter. The main adder A adds an input signal X(z) and an output V(z) from the loop filter, to create U(z)=X(z)+V(z).

The output $V_1(z)$ of the 1-sample delayer D1 is to be expressed by the following formula:

$$V_1(z)=E(z)\cdot Z^{-1}.$$

Next, the first 1st-order differentiator DF1 has a system function $$G_1(z)=(1-z^{-1}),$$

and the output $V_2(z)$ of the first 1st-order differentiator DF1 is expressed by the following formula:

$$V_2(z)=V_1(z)\,(1-z^{-1}).$$

The second 1st-order differentiator DF2 has a system function $$G_2(z)=(1-z^{-1}),$$

and the output $V_3(z)$ of the second 1st-order differentiator DF2 is expressed by the following formula:

$$V_3(z)=V_2(z)\,(1-z^{-1}).$$

Then, the output V(Z) of the first adder A1 to add together the outputs $V_1(z)$, $V_2(z)$ and $V_3(z)$ is as:

$$\begin{aligned}V(z) &= V_1(z)+V_2(z)+V_3(z)\\ &= \{z^{-1}+z^{-1}(1-z^{-1})+z^{-1}(1-z^{-1})^2\}E(z)\\ &= (3z^{-1}-3z^{-2}+z^{-3})E(z).\end{aligned}$$

Accordingly, the main adder A adds together the output V(z) from the loop filter and the input signal X(z) and outputs $$U(z)=X(z)+V(z).$$

The output Y(z) of the quantizer Q is expressed by the following formula:

$$\begin{aligned}Y(z) &= U(z)+N(z)\\ &= X(z)+V(z)+N(z)\\ &= X(z)+(3z^{-1}-3z^{-2}+z^{-3})E(z)+N(z)\\ &= X(z)+(1-3z^{-1}+3z^{-2}-z^{-3})N(z)\\ &= X(z)+(1-z^{-1})^3 N(z)\end{aligned}$$

Accordingly, it is understood that the configuration of the noise shaper in usual is in general 3rd-order as stated above.

Next, the operation of this embodiment of the 3rd-order delta sigma D/A converter will be explained.

Figure 2:
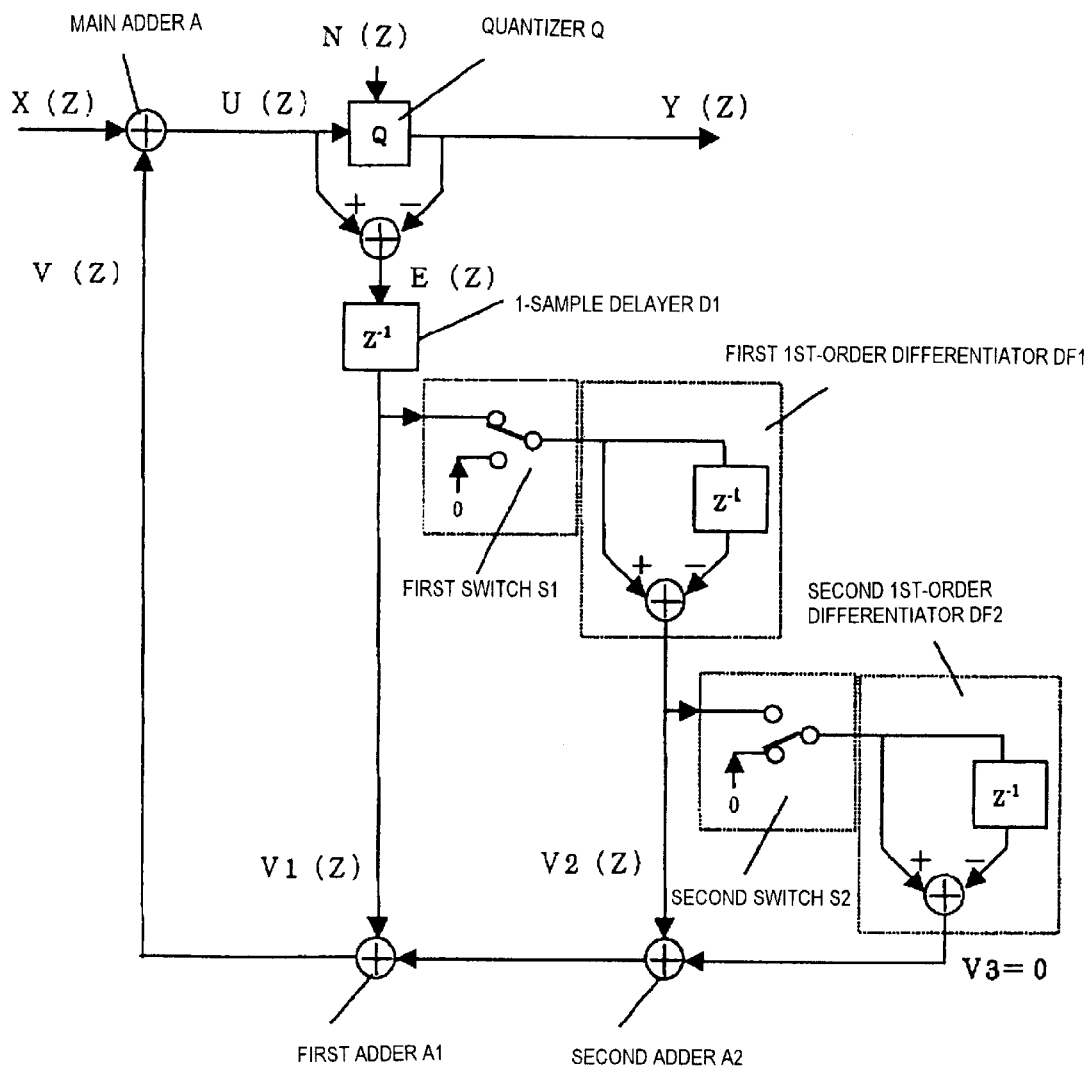
FIG. 2 is a diagram for explaining the operation of the 3rd-order delta sigma D/A converter of the embodiment of FIG. 1.

In the absence of a signal wherein the input signal X(z)=0 as shown in FIG. 2, if a not-shown detector detects this, then the second switch S2 switches to zero value input and renders zero an input of the second 1st-order differentiator DF2. Thereupon, the output $V_3(Z)$ of the second 1st-order differentiator DF2 becomes $$V_3(z)=0. \tag{14}$$

This provides $$\begin{aligned}V(z) &= V_1(z)+V_2(E)+V_3(z)\\ &= \{z^{-1}+z^{-1}(1-Z^{-1})\}E(z)\\ &= (2Z^{-1}-Z^{-2})E(z).\end{aligned} \tag{15}$$

As a result, we obtain $$\begin{aligned}Y(z) &= U(z)+N(z)\\ &= X(z)+V(z)+N(z)\\ &= X(z)+(2z^{-1}-Z^{-2})E(z)+N(z)\end{aligned} \tag{16}$$

-continued $$= X(z) + (1 - 2z^{-1} + Z^{-2})N(z)$$

$$= X(z) + (1 - z^{-1})^2 N(z).$$

This represents the configuration of FIG. 2 has switched into a 2nd-order noise shaper.

Figure 3:
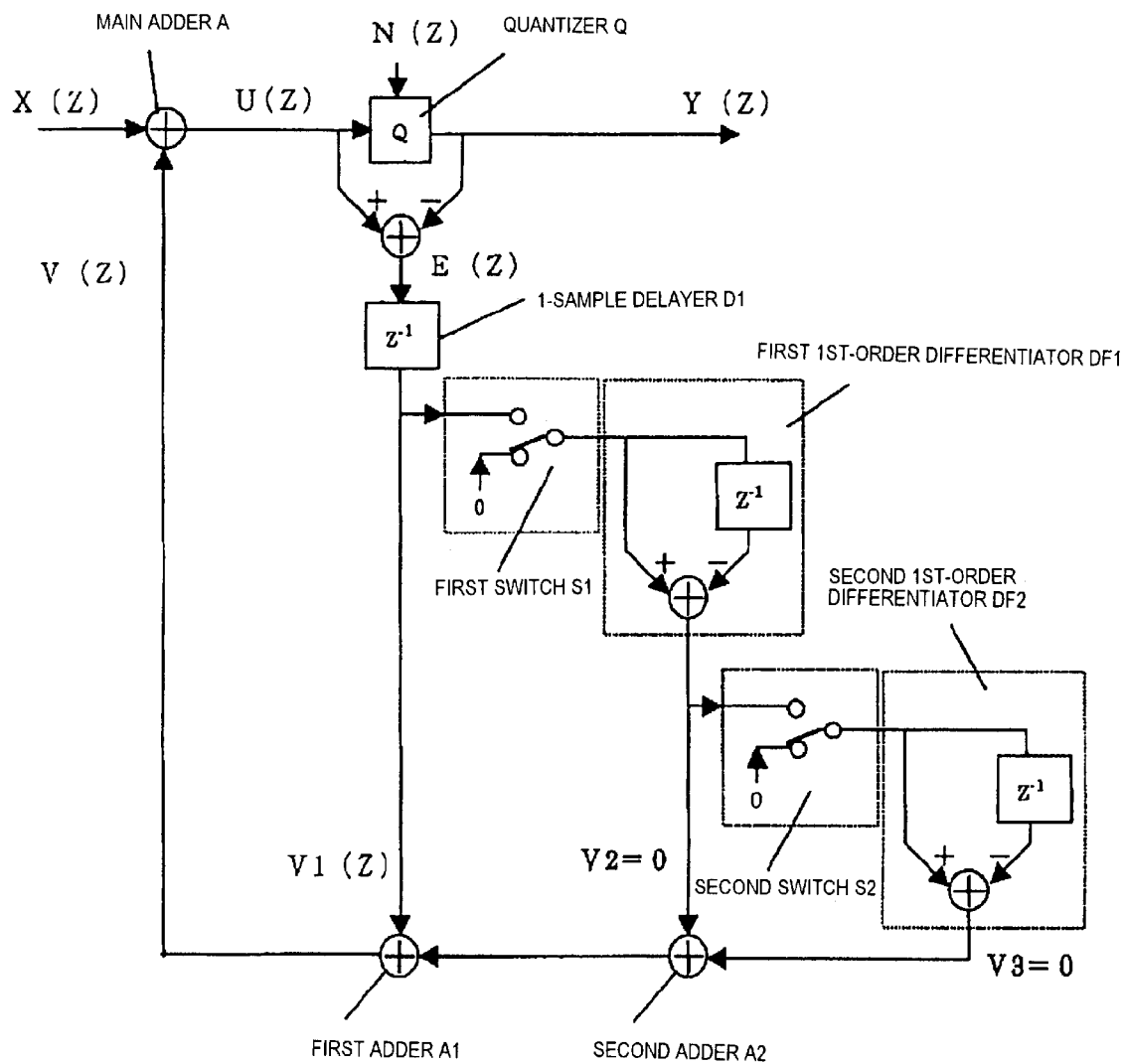
FIG. 3 is a diagram for explaining the operation of the 3rd-order delta sigma D/A converter of the embodiment of FIG. 1.

Then, following the second switch S2 as shown in FIG. 3, the first switch S1 switches into zero value input and renders zero the input of the first 1st-order differentiator DF1. Thereupon, the output $V_2(z)$ of the first 1st-order differentiator becomes $$V_2(z)=0. \qquad (17)$$

This provides $$V(z) = V_1(z) + V_2(z) + V_3(z) \qquad (18)$$

$$= Z^{-1} \cdot E(z).$$

As a result, we obtain $$Y(z) = U(z) + N(z) \qquad (19)$$

$$= X(z) + V(z) + N(z)$$

$$= X(z) + Z^{-1} \cdot E(z) + N(z)$$

$$= X(z) + (1 - Z^{-1})N(z).$$

This represents the configuration of FIG. 3 has switched into a 1st-order noise shaper.

In this manner, sequence operation is made to lower the order of the loop filter in the order of from 3rd-order to 2nd-order and to 1st-order. Because the quantizer Q neglects a signal input of a given value or smaller in the process of quantization, the output signal Y(z) of the quantizer Q finally becomes Y(z)=0. According to this embodiment, output noise of the quantizer Q upon muting can be suppressed as will be explained below. If the order of the loop filter is lowered, the maximum value of noise is delimited by the order of the noise shaper. That is, the output signals are respectively expressed as:

3rd-order: $Y(z)=X(z)+(1-z^{-1})^3 N(z)$

2nd-order: $Y(z)=X(z)+(1-z^{-1})^2 N(z)$

1st-order: $Y(z)=X(z)+(1-z^{-1})N(z).$

Since the magnitude of $Z^{-1}$ is 1, provided that N(z) is given as 1-quantization step, the maximum variation width of noise in each order becomes 3rd-order: $(1-z^{-1})^3 N(z)$ 8-quantization step 2nd-order: $(1-z^{-1})^2 N(z)$ 4-quantization step 1st-order: $(1-z^{-1})N(z)$ 2-quantization step.

This represents that when muting the noise shaper in a idling state even at an input of zero of X(z)=0, there is a possibility of occurring noise greater in the number of quantization step as the order is higher. Accordingly, if the above sequence operation is made wherein, upon stopping the operation of the noise shaper, the order of the loop filter is lowered in order and finally the output signal is rendered zero, then noise occurrence upon operation stoppage is suppressed as great as possible.

Figure 4:
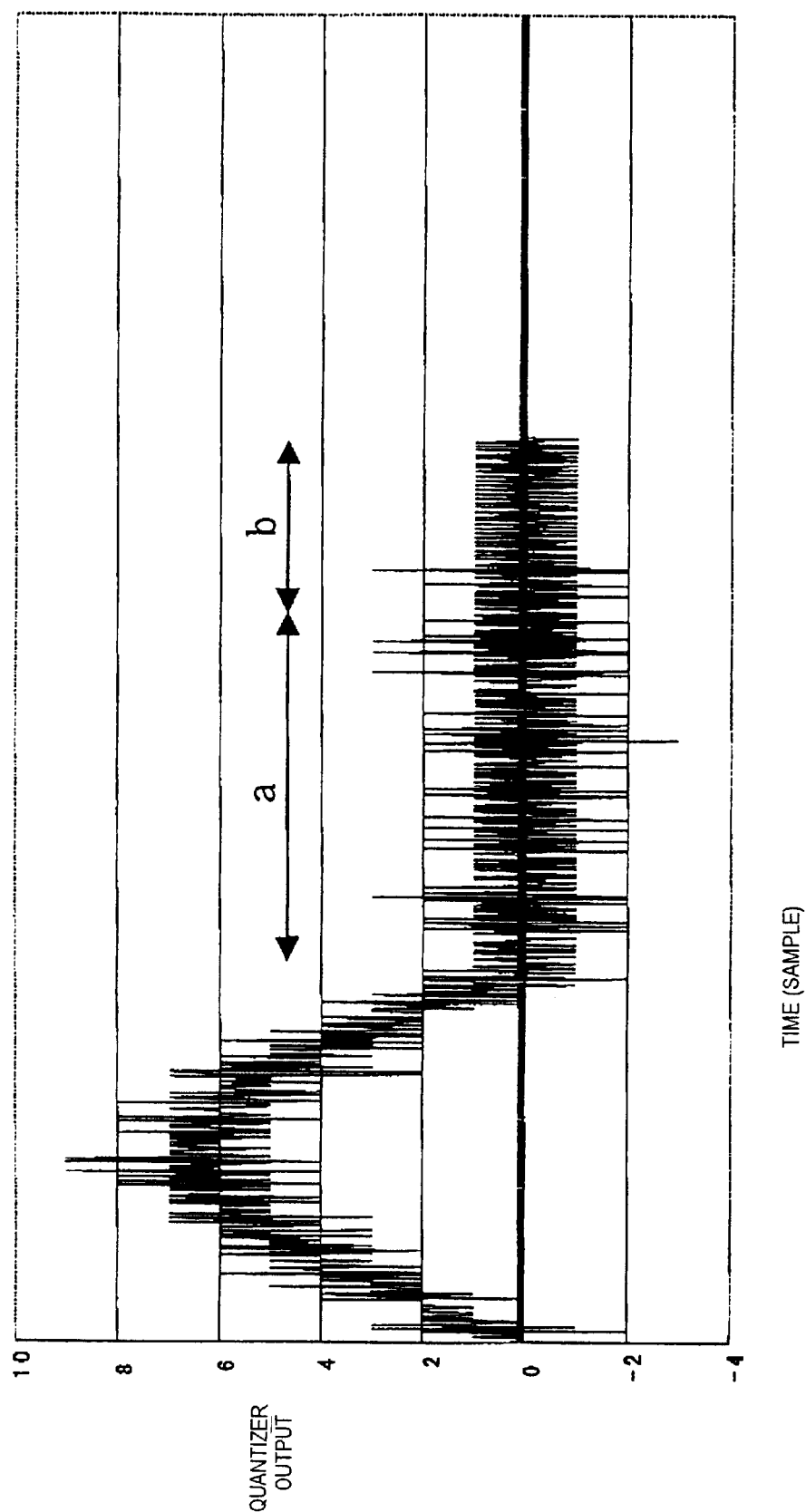
FIG. 4 is a graph showing an output for explaining the operation of the 3rd-order delta sigma D/A converter of the embodiment of FIG. 1.

FIG. 4 is a graph showing an example of an output Y(z) of the quantizer Q upon mute operation in the 3rd-order noise shaper of this embodiment, making possible to understand the effect of the invention. In this example, shown is an operation in a case that the input is rendered zero after an input frequency $f_{in}$=fs/12 is inputted by a half wavelength to the 3rd-order noise shaper having a 23-level quantizer and having a sampling frequency Fns=48fs (fs is a sampling frequency before over-sampling).

Even after the input signal X(z) becomes zero, the output Y(z) of the quantizer Q provides a noise output of plus/minus 3 during a period a. During a period b that the second switch means S2 is switched to zero value input giving $V_3(z)$=0, the output Y(z) of the quantizer Q is a noise output in a level of plus/minus 1. Thereafter, when the first switch means is switched to zero value input giving $V_2(z)$=0 the output Y(z) of the quantizer Q completely becomes zero whereupon no click noise occurs. In this manner, noise upon muting can be reduced by the sequence operation of lowering stepwise the order of the loop filter in the noise shaper.

Incidentally, in circuit design, the timing of switching the second switch means S2 and first switch means S1 to zero value may be set to optimal timing while visually or aurally monitoring sound outputted from the noise shaper upon switching. That is, previous setting may be made such that the timing of monitoring output sound and switching the second switch means S2 to zero value is provided after several-delay period from turning the input X(z) to zero value and the switching the first switch means S1 to zero value is after several-delay period furthermore. With timing thus previously determined, the second switch means S2 and the first switch means S1 may be switched to zero value in order.

Figure 5:
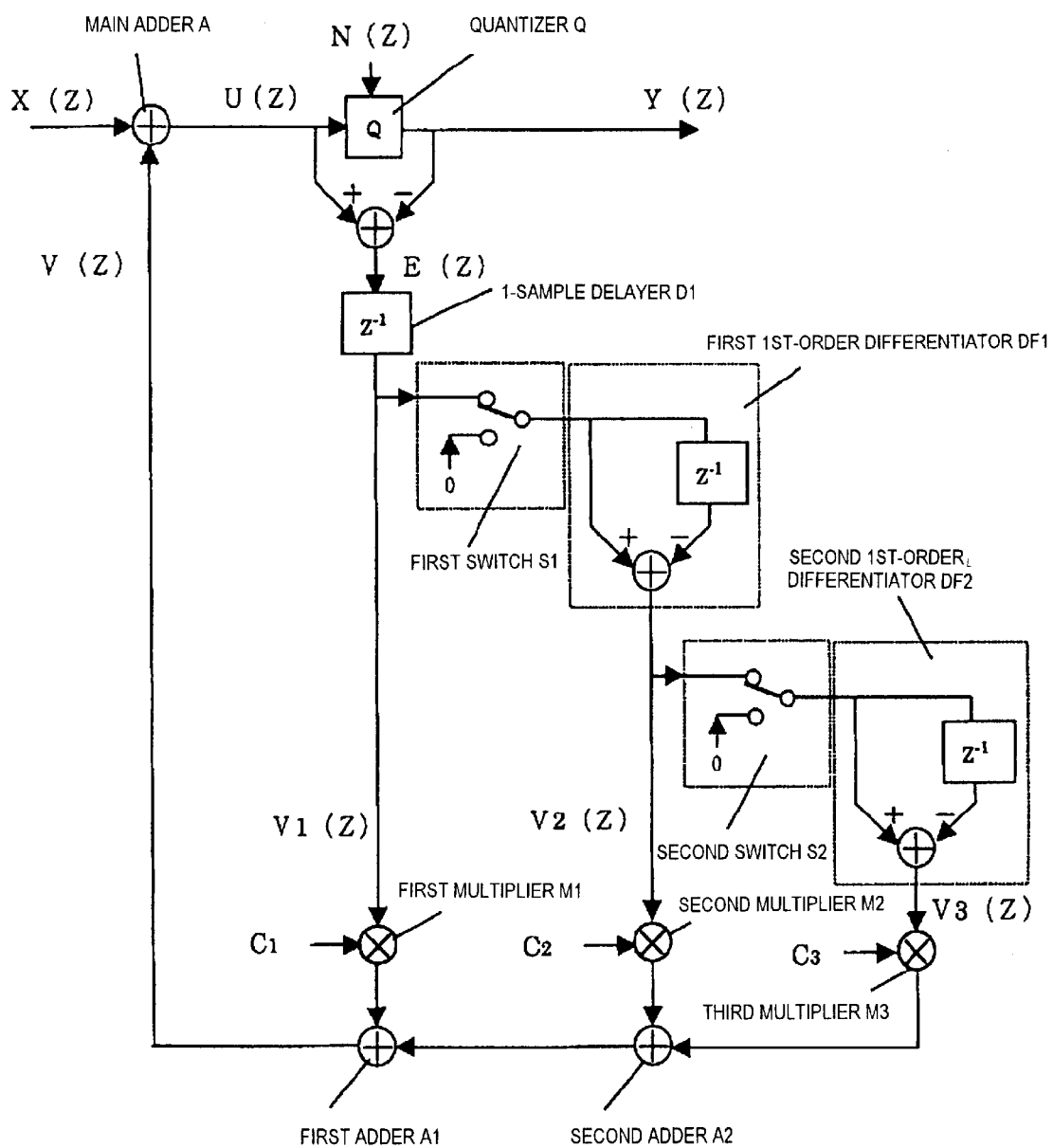
FIG. 5 is a diagram showing a configuration of a 3rd-order delta sigma D/A converter of a second embodiment of the invention.

FIG. 5 is a block diagram showing a second embodiment of the invention. The same constitute parts as the 3rd-order delta sigma D/A converter of the FIG. 1 embodiment are denoted at same reference numerals, omitting explanation. A first multiplier M1 is provided between the 1-sample delayer D1 and the first adder A1, to multiply a predetermined real number $C_1$ on the output $V_1(z)$ of the 1-sample delayer D1 and input as $C_1V_1(z)$ to the first adder A1. Also, a second multiplier M2 and a third multiplier M3 are respectively provided between the first 1st-order differentiator DF1 and second 1st-order differentiator DF2 and the second adder A2, to multiply predetermined real numbers $C_2$, $C_3$ respectively on the output $V_2(z)$ of the first 1st-order differentiator DF1 and the output $V_3(z)$ of the second 1st-order differentiator DF2 and input as $C_2V_2(z)$, $C_3V_3(z)$ to be added together in the second adder A2.

Accordingly, the output value of the loop filter outputted from the first adder A1 is given as:

$$V(z) = C_1 V_1(z) + C_2 V_2(z) + C_3 V_3(z) \qquad (20)$$

$$= \{C_1 z^{-1} + C_2 z^{-1}(1 - z^{-1}) + C_3 z^{-1}(1 - z^{-1})^2\}E(z)$$

$$= \{(C_1 + C_2 + C_3)z^{-1} - (C_2 + 2C_3)z^{-2} + C_3 z^{-3}\}E(z).$$

As a result, we obtain $$Y(z) = U(z) + N(z) \qquad (21)$$

$$= X(z) + V(z) + N(z)$$

$$= X(z) + \{1 - (C_1 + C_2 + C_3)z^{-1} +$$

$$(C_2 + 2C_3)z^{-2} + C_3 z^{-3}\}N(z).$$

Accordingly, $$H(z)=1-(C_1+C_2+C_3)z^{-1}+(C_2+2C_3)Z^{-2}-C_3z^{-3}. \quad (22)$$

This is a 3rd-order formula of z. By arbitrarily setting $C_1$, $C_2$ and $C_3$, an arbitrary 3rd-order noise shaper can be constituted. In this noise shaper, switching the second switch means S2 and the first switch means S1 to zero value in order enables sequence operation of turning the loop filter to 3rd-order, 2nd-order and 1st-order in order, reducing noise in the quantizer output due to mute operation upon no-signal input.

Figure 6:
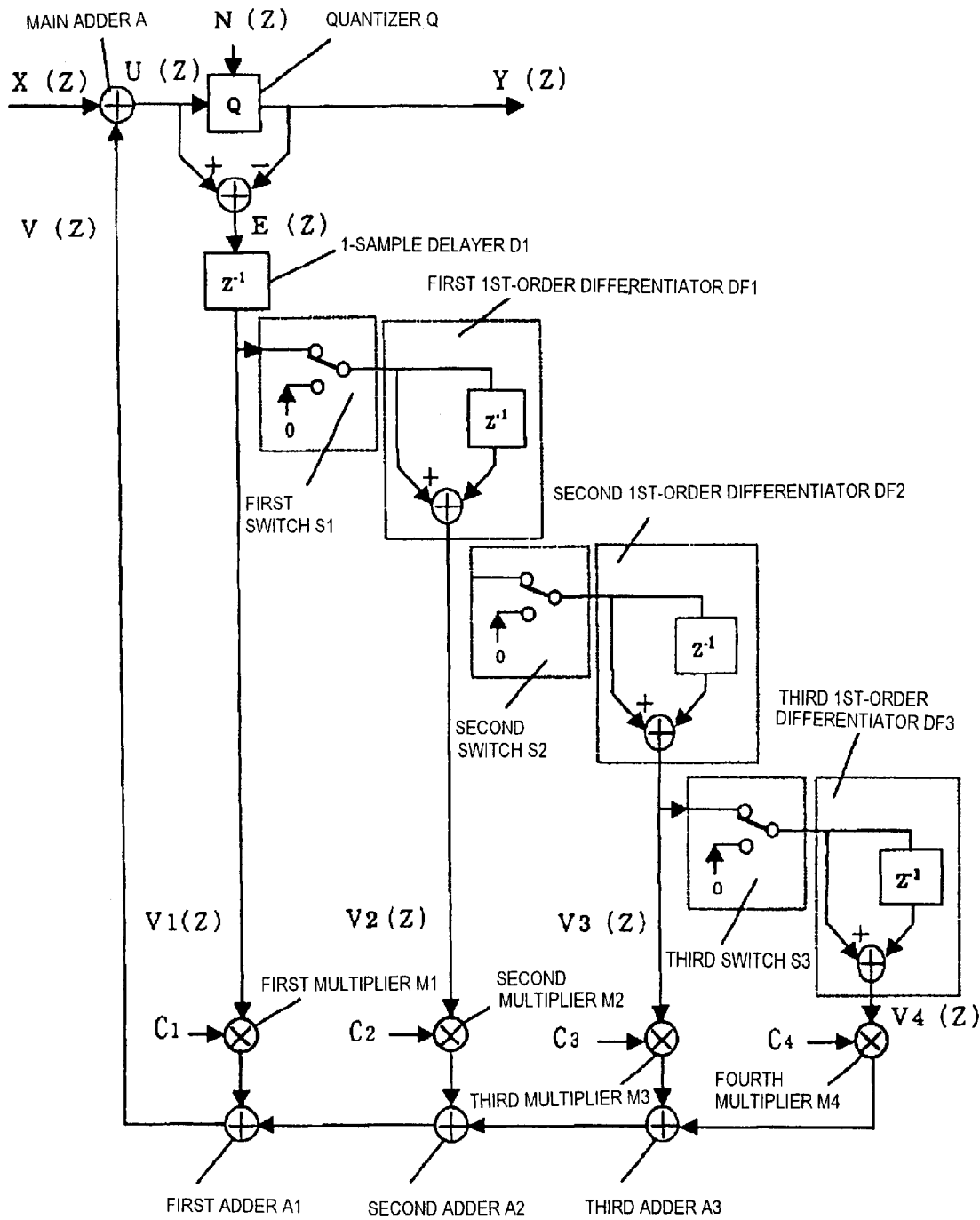
FIG. 6 is a diagram showing a configuration of a 3rd-order delta sigma D/A converter of a third embodiment of the invention.
Figure 7:
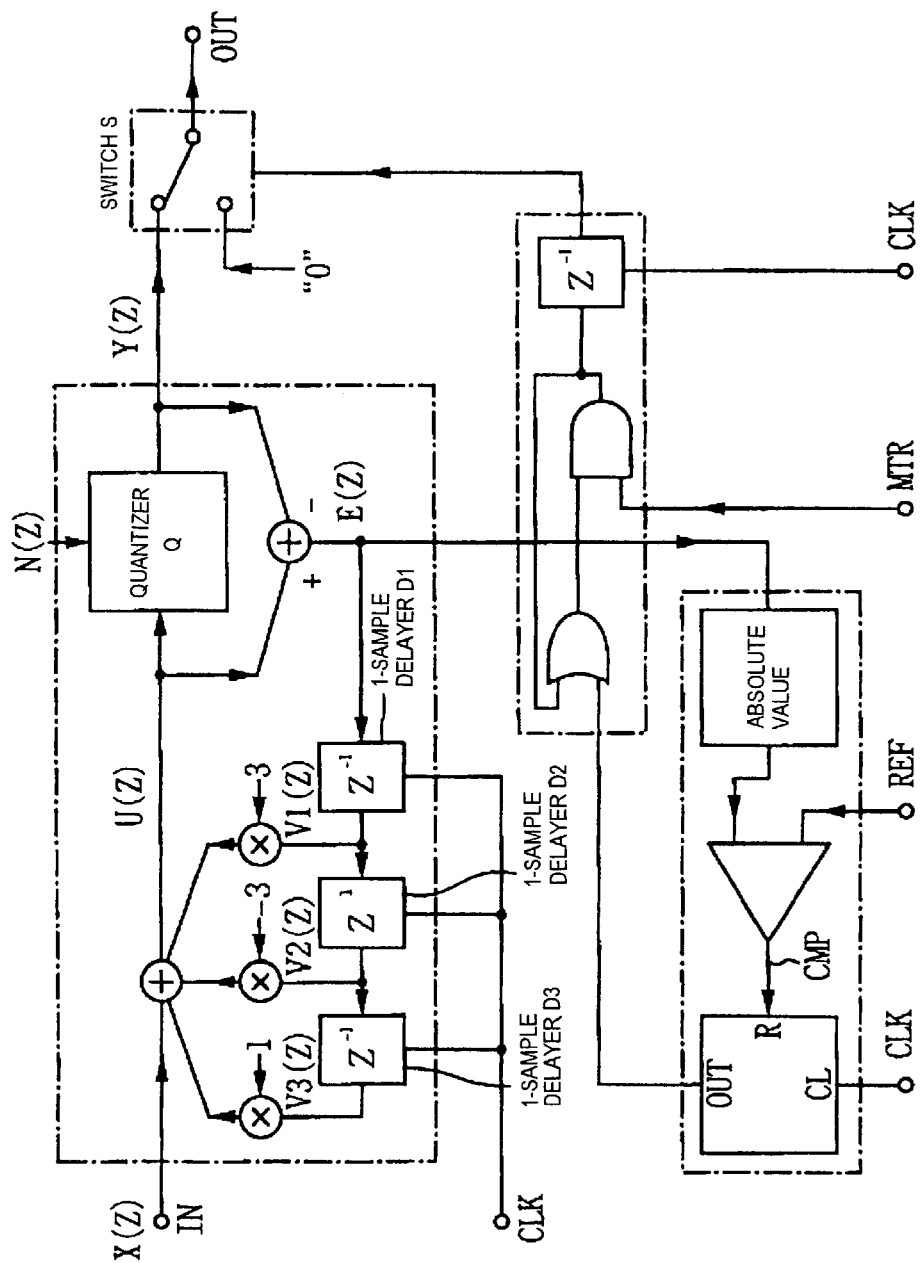
FIG. 7 is a diagram showing a configuration of a 3rd-order delta sigma D/A converter of a prior art.

FIG. 6 shows a third embodiment of the invention. This embodiment shows a configuration of a 4th-order delta sigma D/A converter. The same constituent parts as the embodiment shown in FIG. 1 and FIG. 5 are denoted at the same reference numerals, omitting explanation. In the FIG. 6 embodiment, a third 1st-order differentiator DF3 is provided to which is inputted an output $V_3(z)$ of the second 1st-order differentiator DF2. A third switch means S3 is provided to selectively switch the input to the third 1st-order differentiator DF3 from $V_3(z)$ to zero value. A fourth multiplier M4 is provided to multiply a predetermined real number $C_4$ on an output $V_4(z)$ of the third 1st-order differentiator DF3. A third adder A3 for adding together the output $V_3(z)$ of the second 1st-order differentiator DF2 and the output $V_4(z)$ of the third 1st-order differentiator DF3 is provided to input a sum output thereof to the second adder A2.

Consequently, the output V(z) of the loop filter of FIG. 6 is given by the following, which is a 4th-order configuration:

$$V(z) = C_1 V_1(z) + C_2 V_2(z) + C_3 V_3(z) + C_4 V_4(z) \quad (23)$$

$$= \{C_1 z^{-1} + C_2 z^{-1}(1-z^{-1}) + C_3 z^{-1}(1-z^{-1})^2 +$$

$$C_4 z^{-1}(1-z^{-1})^3\} E(z)$$

$$= \{(C_1 + C_2 + C_3 + C_4)z^{-1} - (C_2 + 2C_3 + 3C_4)z^{-2} +$$

$$(C_3 + C_4)z^{-3} - C_4 z^{-4}\} E(z).$$

In also this embodiment, when performing muting at an input of no signal, the third switch means S3 in the highest order is first switched to zero value input providing $V_4(z)=0$. Then, the switch means S2, S1 in the lower order are switched to zero value input in order. This switches the loop filter in the order of 4th-order, 3rd-order, 2nd-order and 1st-order. Finally, the output of the quantizer can be brought to zero value. This sequence operation can suppress noise from occurring, similarly to the above.

In also this embodiment, the timing of switching the third switch means S3, second switch means S2 and first switch means S1 may be previously set so as to be switched in optimal timing while monitoring sound that possibly occurs during switching in designing the circuit of this embodiment. That is, previous setting may be made such that the third switch means S3 is switched to zero value after several-delay period from turning the input X(z) to zero value and thereafter the second and first switch means S2, S1 are switched in order at respective intervals of several-delay period.

Incidentally, in the present invention, the meaning of switching into zero value of from the higher-order switch means to the lower-order switch means in order includes switching of several switch means simultaneously to zero value. For example, in the third embodiment of FIG. 6, the second and first switch means may be switched simultaneously to zero value after switching the third switch means to zero value. Also, the first switch means may be switched to zero value after switching the third and second switch means simultaneously to zero value. That is, the meaning of switching into zero value of from the higher-order switch means to the lower-order switch means may include switching a plurality of sets of switch means divided according to the order to zero value in the order of from the higher-order set.

From the above explanations, it is easily possible to configure the present invention as generally an nth-order (n is an integer of 2 or greater) of a plural-numbered order of delta sigma D/A converter.

According to the plural-numbered order of delta sigma D/A converter of the invention, no click noise occurs in mute operation at no-signal input, and hence there is an effect of eliminating a circuit for removing this.

What is claimed is:

1. In an nth-order (n is an integer of 2 or greater) delta sigma D/A converter, the nth-order delta sigma D/A converter comprising:

a main adder to be inputted by an input signal;

a quantizer having as an input an output of said main adder;

a 1-sample delayer having as an input a quantization error by said quantizer;

1st-order differentiators of (n−1) in number connected continuous to an output side of said 1-sample delayer;

switch means of (n−1) in number for switching each output of said 1st-order differentiators to zero value; and adders of (n−1) in number connected continuous to add together outputs of said 1st-order differentiators or an output of said 1-sample delayer, characterized in that:

a sum of said adder of (n−1) in number is added with the input signal by said main adder;

when the input signal is zero value, said switch means of (n−1) in number being switched to zero value in the order of from a highest order to a lower order, inputs of said 1st-order differentiators of (n−1) in number being rendered zero value, and an output value of said nth-order delta sigma D/A converter being rendered finally zero value.

2. An nth-order delta sigma D/A converter according to claim 1, having multipliers of n in number provided on an input side of said adders of (n−1) in number and for multiplying an output of said 1-sample delayer or outputs of said 1st-order differentiators of (n−1) in number by a predetermined real number.

3. An nth-order delta sigma D/A converter according to claim 1, the n is 3 or 4.

4. In a 3rd-order delta sigma D/A converter, the nth-order delta sigma D/A converter comprising:

a main adder to be inputted by an input signal;

a quantizer having as an input an output of said main adder;

a 1-sample delayer having as an input a quantization error by said quantizer;

a first 1st-order differentiator having as input an output of said 1-sample delayer;

first switch means for switching an output of said first 1st-order differentiator to zero value;

a second 1st-order differentiator having as input an output of said first 1st-order differentiator;

second switch means for switching an input of said second 1st-order differentiator to zero value;

a first adder for inputting an output of said 1-sample delayer; and a second adder for adding outputs of said first and second 1st-order differentiators, the 3rd-order delta sigma D/A converter characterized in that:

an output of said second adder is added with an output of said 1-sample delayer by said first adder; an output of said first adder being added with the input signal by said main adder; when the input signal is zero value, an input to said second 1st-order differentiator being switched to zero value by said second switch means and then an input to said first 1st-order differentiator being switched to zero value by said first switch means, and an output value of said 3rd-order delta sigma D/A converter being rendered finally zero value.

5. A 3rd-order delta sigma D/A converter according to claim 4, having a first multiplier, a second multiplier and a third multiplier, each predetermined real number is multiplied on an output value of said 1-sample delayer, an output value of said first 1st-order differentiator and an output value of said second 1st-order differentiator, and a result of multiplication being added in each of said adder.

* * * * *